United States Patent
Kang

(10) Patent No.: US 9,748,211 B2
(45) Date of Patent: Aug. 29, 2017

(54) ARRAY-TYPE DOUBLE-SIDE LIGHT-EMITTING DEVICE AND MANUFACTURING METHOD THEREOF AND DOUBLE-SIDE DISPLAY DEVICE

(71) Applicants: BOE TECHNOLOGY GROUP CO., LTD., Beijing (CN); HEFEI BOE DISPLAY LIGHT CO., LTD., Hefi, Anhui (CN)

(72) Inventor: Yaling Kang, Beijing (CN)

(73) Assignees: BOE TECHNOLOGY GROUP CO., LTD., Beijing (CN); HEFEI BOE DISPLAY LIGHT CO., LTD., Hefei, Anhui (CN)

( * ) Notice: Subject to any disclaimer, the term of this patent is extended or adjusted under 35 U.S.C. 154(b) by 0 days.

(21) Appl. No.: 15/038,217

(22) PCT Filed: Oct. 8, 2015

(86) PCT No.: PCT/CN2015/091433
§ 371 (c)(1),
(2) Date: May 20, 2016

(87) PCT Pub. No.: WO2016/206228
PCT Pub. Date: Dec. 29, 2016

(65) Prior Publication Data
US 2017/0179087 A1    Jun. 22, 2017

(30) Foreign Application Priority Data
Jun. 25, 2015  (CN) .......................... 2015 1 0356574

(51) Int. Cl.
*H01L 27/32* (2006.01)
*H01L 25/075* (2006.01)
(Continued)

(52) U.S. Cl.
CPC ...... *H01L 25/0756* (2013.01); *H01L 25/0753* (2013.01); *H01L 25/50* (2013.01);
(Continued)

(58) Field of Classification Search
None
See application file for complete search history.

(56) References Cited

U.S. PATENT DOCUMENTS 7,792,489 B2 * 9/2010 Hirakata .............. H01L 27/3211
313/512
2008/0084159 A1   4/2008 Fery et al.
(Continued)

FOREIGN PATENT DOCUMENTS

CN    102683550    9/2012
CN    202796951    3/2013
(Continued)

OTHER PUBLICATIONS

International Search Report and Written Opinion with English Language Translation, dated Mar. 25, 2016, Application No. PCT/CN2015/091433.
(Continued)

*Primary Examiner* — Minh-Loan Tran
(74) *Attorney, Agent, or Firm* — Blakely Sokoloff Taylor & Zafman LLP

(57) ABSTRACT

The present invention relates to an array-type double-side light-emitting device, a manufacturing method thereof and a double-side display device. The array-type double-side light-emitting device comprises: a first protective layer, a first fluorescent layer or quantum dot layer, an array of first transparent conductive layers, a first anisotropic conductive adhesive layer, an array of light-emitting wafers, a second anisotropic conductive adhesive layer, an array of second transparent conductive layers, a second fluorescent layer or
(Continued)

quantum dot layer and a second protective layer, which are attached together sequentially.

20 Claims, 6 Drawing Sheets

(51) Int. Cl.
*H01L 33/62* (2010.01)
*H01L 25/00* (2006.01)
*H01L 33/50* (2010.01)
*H01L 27/15* (2006.01)

(52) U.S. Cl.
CPC .......... *H01L 27/153* (2013.01); *H01L 27/156* (2013.01); *H01L 27/32* (2013.01); *H01L 27/3202* (2013.01); *H01L 27/3204* (2013.01); *H01L 27/3206* (2013.01); *H01L 27/3241* (2013.01); *H01L 27/3244* (2013.01); *H01L 27/3251* (2013.01); *H01L 33/502* (2013.01); *H01L 33/507* (2013.01); *H01L 33/62* (2013.01); *H01L 2251/5323* (2013.01); *H01L 2251/5338* (2013.01)

(56) References Cited

U.S. PATENT DOCUMENTS

| | | | |
|---|---|---|---|
| 2015/0153626 A1 | 6/2015 | Cai | |
| 2016/0329381 A1* | 11/2016 | Xu | ............................ G02F 1/157 |
| 2016/0380153 A1* | 12/2016 | Lee | ......................... H01L 33/32 257/76 |

FOREIGN PATENT DOCUMENTS

| | | |
|---|---|---|
| CN | 202940270 | 5/2013 |
| CN | 202940270 U | 5/2013 |
| CN | 103210516 | 7/2013 |
| CN | 203363722 | 12/2013 |
| CN | 103915546 A | 7/2014 |
| KR | 101277546 B1 | 6/2013 |
| TW | 201503424 | 1/2015 |
| WO | WO 2014190629 A1 | 12/2014 |

OTHER PUBLICATIONS

Office Action in Chinese Application No. 201510356574.7 dated Jun. 28, 2017, with English translation.

* cited by examiner

ARRAY-TYPE DOUBLE-SIDE LIGHT-EMITTING DEVICE AND MANUFACTURING METHOD THEREOF AND DOUBLE-SIDE DISPLAY DEVICE

RELATED APPLICATIONS

The present application is the U.S. national phase entry of PCT/CN2015/091433, with an international filing date of Oct. 8, 2015, which claims the benefit of Chinese Patent Application No. 201510356574.7, filed on Jun. 25, 2015, the entire disclosures of which are incorporated herein by reference.

TECHNICAL FIELD

The present invention relates to the field of double-side display, and in particular to a double-side light-emitting device, an array-type double-side light-emitting device, a method for manufacturing an array-type double-side light-emitting device as well as a double-side display device.

BACKGROUND ART

A double-side light-emitting device in the prior art, e.g., a sandwich type light-emitting diode (LED) light source module with two sides emitting light as disclosed in CN203363722U, comprises an upper electricity conducting layer, an upper insulating layer, a heat conducting layer, a lower insulating layer and a lower electricity conducting layer stacked from top to bottom. The upper electricity conducting layer and the lower electricity conducting layer are both provided with a plurality of LED components. The sandwich type structural design lays a structural foundation for the LED light source module to emit light on two sides. The LED components are directly arranged on upper and lower surfaces to emit light on two sides. However, many defects exist, such as impossibility of flexible display, complication of structure and manufacturing process and a thicker overall thickness of the sandwich type LED light source module with two sides emitting light.

Therefore, there is an urgent need for improvement in the prior art.

SUMMARY

To this end, the present invention provides a double-side light-emitting device, an array-type double-side light-emitting device, a method for manufacturing an array-type double-side light-emitting device and a double-side display device capable of solving or at least alleviating at least part of the defects in the prior art.

According to a first aspect of the present invention, a double-side light-emitting device is provided, which can comprise: a first protective layer, a first fluorescent layer or quantum dot layer, a first transparent conductive layer, a first anisotropic conductive adhesive layer, a light-emitting wafer, a second anisotropic conductive adhesive layer, a second transparent conductive layer, a second fluorescent layer or quantum dot layer and a second protective layer, which are arranged together sequentially.

By means of the first anisotropic conductive adhesive layer, the light-emitting wafer is electrically connected to the first transparent conductive layer. By means of the second anisotropic conductive adhesive layer, the light-emitting wafer is electrically connected to the second transparent conductive layer. As compared with a double-side light-emitting device in the prior art, the double-side light-emitting device in the present invention is simpler in structure and manufacture, and smaller in overall thickness, which facilitates the manufacture of a minimized ultrathin electronic device with two sides emitting light.

In an embodiment of the present invention, the double-side light-emitting device can further comprise: a first transparent gel layer arranged between the first fluorescent layer or quantum dot layer and the first transparent conductive layer, and a second transparent gel layer arranged between the second fluorescent layer or quantum dot layer and the second transparent conductive layer.

In another embodiment of the present invention, the first anisotropic conductive adhesive layer electrically connects the first transparent conductive layer to the light-emitting wafer, and the second anisotropic conductive adhesive layer electrically connects the second transparent conductive layer to the light-emitting wafer.

In yet another embodiment of the present invention, the first protective layer, the first fluorescent layer or quantum dot layer, the first transparent conductive layer, the first anisotropic conductive adhesive layer, the light-emitting wafer, the second anisotropic conductive adhesive layer, the second transparent conductive layer, the second fluorescent layer or quantum dot layer and the second protective layer are arranged plane-symmetrically about the light-emitting wafer.

In a further embodiment of the present invention, the light-emitting wafer is an LED light-emitting wafer emitting red light, green light or blue light, and both the first fluorescent layer or quantum dot layer and the second fluorescent layer or quantum dot layer emit light of complementary color selected from cyan, purple and yellow.

According to a second aspect of the present invention, an array-type double-side light-emitting device is provided, which can comprise: a first protective layer, a first fluorescent layer or quantum dot layer, an array of first transparent conductive layers, a first anisotropic conductive adhesive layer, an array of light-emitting wafers, a second anisotropic conductive adhesive layer, an array of second transparent conductive layers, a second fluorescent layer or quantum dot layer and a second protective layer, which are arranged together sequentially.

By means of the first anisotropic conductive adhesive layer and the second anisotropic conductive adhesive layer, the array of light-emitting wafers is electrically connected to the array of first transparent conductive layers and the array of second transparent conductive layers respectively. As compared with an array-type double-side light-emitting device in the prior art, the array-type double-side light-emitting device in the present invention achieves flexible display and hence is suitable for the manufacture of a flexible display device. It is simpler in structure, which helps to cut down costs, and smaller in overall thickness, which facilitates the manufacture of a minimized ultrathin electronic device with two sides emitting light.

In an embodiment of the present invention, the array-type double-side light-emitting device can further comprise: a first transparent gel layer arranged between the first fluorescent layer or quantum dot layer and the array of first transparent conductive layers, and a second transparent gel layer arranged between the second fluorescent layer or quantum dot layer and the array of second transparent conductive layers.

In another embodiment of the present invention, the first anisotropic conductive adhesive layer electrically connects each first transparent conductive layer in the array of first transparent conductive layers to each light-emitting wafer in the array of light-emitting wafers in a corresponding manner, and the second anisotropic conductive adhesive layer electrically connects each second transparent conductive layer in the array of second transparent conductive layers to each light-emitting wafer in the array of light-emitting wafers in a corresponding manner.

In yet another embodiment of the present invention, the first protective layer, the first fluorescent layer or quantum dot layer, the array of first transparent conductive layers, the first anisotropic conductive adhesive layer, the array of light-emitting wafers, the second anisotropic conductive adhesive layer, the array of second transparent conductive layers, the second fluorescent layer or quantum dot layer and the second protective layer are arranged plane-symmetrically about the array of light-emitting wafers.

In a further embodiment of the present invention, the array of light-emitting wafers comprises LED light-emitting wafers emitting red light, green light or blue light, and both the first fluorescent layer or quantum dot layer and the second fluorescent layer or quantum dot layer emit light of complementary color selected from cyan, purple and yellow.

According to a third aspect of the present invention, a method for manufacturing an array-type double-side light-emitting device is provided, comprising steps of: coating on or attaching to a first protective layer a first fluorescent layer or quantum dot layer; arranging an array of first transparent conductive layers on the first fluorescent layer or quantum dot layer; arranging a first anisotropic conductive adhesive layer on the array of first transparent conductive layers; arranging an array of light-emitting wafers on the first anisotropic conductive adhesive layer; arranging a second anisotropic conductive adhesive layer on the array of light-emitting wafers; arranging an array of second transparent conductive layers on the second anisotropic conductive adhesive layer; arranging a second fluorescent layer or quantum dot layer on the array of second transparent conductive layers; arranging a second protective layer on the second fluorescent layer or quantum dot layer; laminating the above layers such that each light-emitting wafer in the array of light-emitting wafers is electrically connected to a corresponding first transparent conductive layer in the array of first transparent conductive layers and a corresponding second transparent conductive layer in the array of second transparent conductive layers.

In an embodiment of the present invention, wherein arranging an array of light-emitting wafers on the first anisotropic conductive adhesive layer comprises: the array of first transparent conductive layers comprises a first transparent conductive layer substrate and an array of first transparent conductive layer electrodes carried on the first transparent conductive layer substrate, and each light-emitting wafer in the array of light-emitting wafers is arranged on the first anisotropic conductive adhesive layer corresponding to each first transparent conductive layer electrode in the array of first transparent conductive layer electrodes.

In another embodiment of the present invention, wherein arranging a second anisotropic conductive adhesive layer on the array of light-emitting wafers comprises: the array of second transparent conductive layers comprises a second transparent conductive layer substrate and an array of second transparent conductive layer electrodes carried on the second transparent conductive layer substrate, and each second transparent conductive layer electrode in the array of second transparent conductive layer electrodes is arranged on the second anisotropic conductive adhesive layer corresponding to each light-emitting wafer in the array of light-emitting wafers.

In yet another embodiment of the present invention, wherein arranging an array of first transparent conductive layers on the first fluorescent layer or quantum dot layer comprises: arranging the array of first transparent conductive layers on the first fluorescent layer or quantum dot layer by means of a first transparent gel layer; wherein arranging a second fluorescent layer or quantum dot layer on an array of second transparent conductive layers comprises: arranging the second fluorescent layer or quantum dot layer on the array of second transparent conductive layers by means of a second transparent gel layer.

In a further embodiment of the present invention, the array of light-emitting wafers comprises LED light-emitting wafers emitting red light, green light or blue light, and both the first fluorescent layer or quantum dot layer and the second fluorescent layer or quantum dot layer emit light of complementary color selected from cyan, purple and yellow.

According to a fourth aspect of the present invention, a method for manufacturing an array-type double-side light-emitting device is provided, comprising steps of: attaching an array of first transparent conductive layers to an array of light-emitting wafers by means of a first anisotropic conductive adhesive layer; attaching the array of light-emitting wafers to an array of second transparent conductive layers by means of a second anisotropic conductive adhesive layer; laminating the array of first transparent conductive layers, the array of light-emitting wafers and the array of second transparent conductive layers such that the array of first transparent conductive layers and the array of second transparent conductive layers are electrically connected to the array of light-emitting wafers; coating a first fluorescent layer or quantum dot layer and a second fluorescent layer or quantum dot layer respectively on a surface of the array of first transparent conductive layers and a surface of the array of second transparent conductive layers, and coating a first protective layer and a second protective layer respectively on the first fluorescent layer or quantum dot layer and the second fluorescent layer or quantum dot layer.

In an embodiment of the present invention, wherein attaching an array of first transparent conductive layers to an array of light-emitting wafers by means of a first anisotropic conductive adhesive layer comprises: the array of first transparent conductive layers comprises a first transparent conductive layer substrate and an array of first transparent conductive layer electrodes carried on the first transparent conductive layer substrate, and each first transparent conductive layer electrode in the array of first transparent conductive layer electrodes is attached to each light-emitting wafer in the array of light-emitting wafers by means of the first anisotropic conductive adhesive layer in a corresponding manner.

In another embodiment of the present invention, wherein attaching the array of light-emitting wafers to an array of second transparent conductive layers by means of a second anisotropic conductive adhesive layer comprises: the array of second transparent conductive layers comprises a second transparent conductive layer substrate and an array of second transparent conductive layer electrodes carried on the second transparent conductive layer substrate, and each light-emitting wafer in the array of light-emitting wafers is attached to each second transparent conductive layer electrode in the array of second transparent conductive layer electrodes by means of the second anisotropic conductive adhesive layer in a corresponding manner.

In yet another embodiment of the present invention, the array of light-emitting wafers comprises LED light-emitting wafers emitting red light, green light or blue light, and both the first fluorescent layer or quantum dot layer and the second fluorescent layer or quantum dot layer emit light of complementary color selected from cyan, purple and yellow.

According to a fifth aspect of the present invention, a double-side display device is provided, comprising the above double-side light-emitting device, the above array-type double-side light-emitting device, or an array-type double-side light-emitting device manufactured by using the above method for manufacturing an array-type double-side light-emitting device.

DETAILED DESCRIPTION OF EMBODIMENTS

The present invention shall be described in details as follows with reference to the drawings of the present invention.

Reference signs: 2—first protective layer, 4—first fluorescent layer or quantum dot layer, 6—first transparent conductive layer, 8—first anisotropic conductive adhesive layer, 10—double-side light-emitting device, 12—light-emitting wafer, 14—second anisotropic conductive adhesive layer, 16—second transparent conductive layer, 18—second fluorescent layer or quantum dot layer, 20—second protective layer, 5—first transparent gel layer, 17—second transparent gel layer, 30—array-type double-side light-emitting device, 3—conductive electrode of first transparent conductive layer, 9—first transparent conductive layer substrate, 7—conductive line of first transparent conductive layer, D—symmetry plane, 15—conductive electrode of second transparent conductive layer, 11—second transparent conductive layer substrate, 13—conductive line of second transparent conductive layer.

Figure 1:
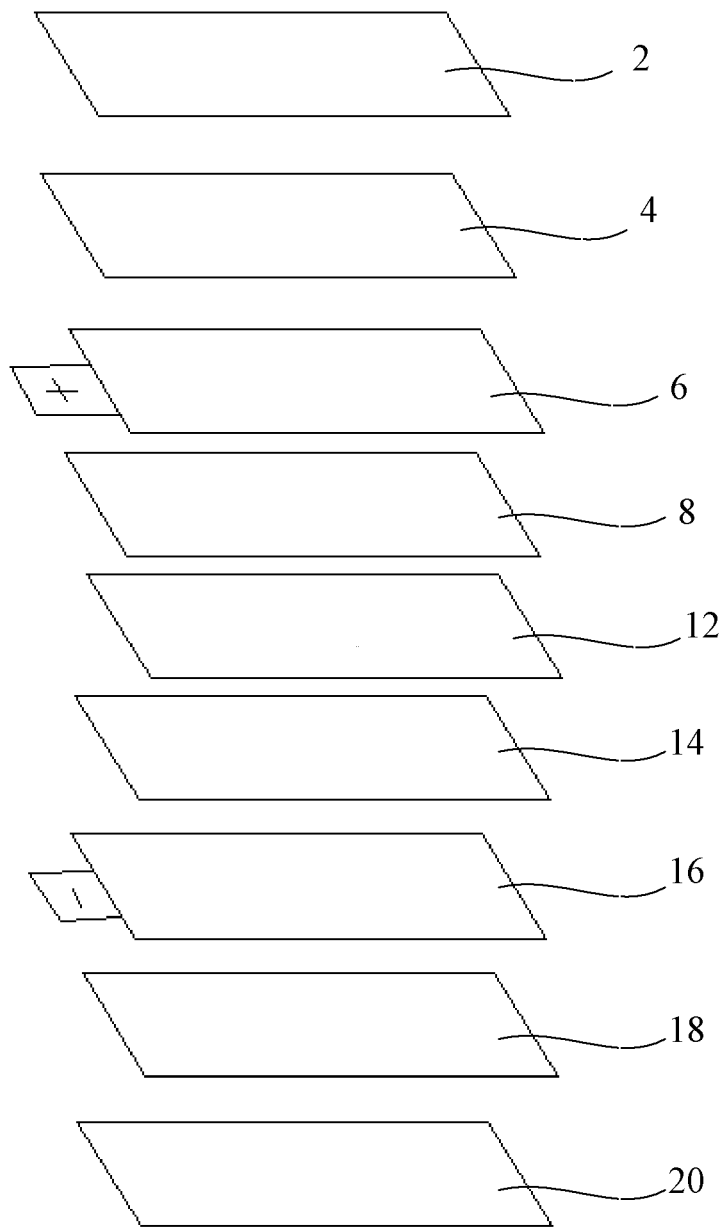
FIG. 1 schematically shows a double-side light-emitting device according to an embodiment of the present invention.

FIG. 1 schematically shows a double-side light-emitting device 10 according to a first aspect of the present invention, which can comprise: a first protective layer 2, a first fluorescent layer or quantum dot layer 4, a first transparent conductive layer 6, a first anisotropic conductive adhesive layer 8, a light-emitting wafer 12, a second anisotropic conductive adhesive layer 14, a second transparent conductive layer 16, a second fluorescent layer or quantum dot layer 18 and a second protective layer 20, which are arranged together sequentially. The first fluorescent layer or quantum dot layer 4 and the second fluorescent layer or quantum dot layer 18 can be fluorescent layers made of yttrium aluminum garnet (YAG) fluorescent powder or quantum dot layers obtained by thin coating quantum dots. Using the fluorescent layers or the quantum dot layers can help to improve the color gamut of the display and increase the brightness of the double-side light-emitting device.

The first anisotropic conductive adhesive layer 8 and the second anisotropic conductive adhesive layer 14 to be used in each embodiment of the present invention mainly comprise electrically conductive particles and insulating adhesive materials, and a protective film is provided on the upper and lower surfaces of an anisotropic conductive adhesive layer respectively for protecting the major components. The upper protective film is usually torn off firstly in use, and anisotropic conductive adhesive films are arranged onto electrodes of a substrate, and then the lower protective film is also torn off. After accurate alignment, objects above are laminated with underlying plates, and the insulating adhesive materials are cured after being heated and pressed for a certain period, and a stable structure which is perpendicularly conductive and laterally insulating is finally formed. Anisotropic conductive adhesive layers are mainly applied in a manufacturing process where high-temperature tin/lead soldering is inapplicable, e.g., for connecting lines of a flexible circuit board, a plastic credit card and a liquid crystal display, and mainly applied in fields relative to drive integrated circuits. In each embodiment of the present invention, by means of the first anisotropic conductive adhesive layer 8 and the second anisotropic conductive adhesive layer 14, the light-emitting wafer 12 is electrically connected to the first transparent conductive layer 6 and the second transparent conductive layer 16. As compared with a double-side light-emitting device in the prior art, the double-side light-emitting device in the present invention is simpler in structure and manufacture, and smaller in overall thickness.

The first transparent conductive layer 6 shown in FIG. 1 serves as an anode of the double-side light-emitting device, and the second transparent conductive layer 16 serves as a cathode of the double-side light-emitting device. The anode and the cathode are configured to receive a voltage and a current to be applied. It will appreciated that, alternatively, the first transparent conductive layer 6 can also serve as a cathode of the double-side light-emitting device, and the second transparent conductive layer 16 can also serve as an anode of the double-side light-emitting device.

Figure 4:
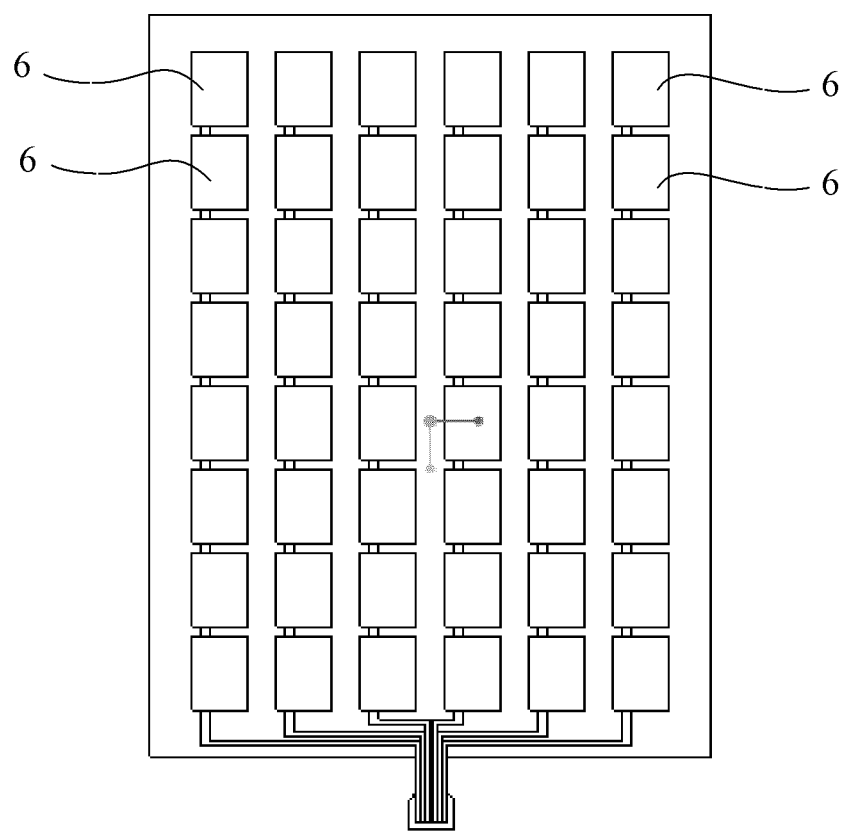
FIG. 4 schematically shows an array of first transparent conductive layers according to an embodiment of the present invention.

In an alternative embodiment of the present invention, the double-side light-emitting device can further comprise: a first transparent gel layer 5 arranged between the first fluorescent layer or quantum dot layer 4 and the first transparent conductive layer 6, and a second transparent gel layer 17 arranged between the second fluorescent layer or quantum dot layer 18 and the second transparent conductive layer 16. By means of the first transparent gel layer 5 and the second transparent gel layer 17, the first fluorescent layer or quantum dot layer 4 can also be arranged together with the first transparent conductive layer 6, and the second fluorescent layer or quantum dot layer 18 can also be arranged together with the second transparent conductive layer 16. FIG. 4 shows a case for the first transparent gel layer 5 and the second transparent gel layer 17.

In one embodiment of the present invention, the first anisotropic conductive adhesive layer 8 electrically connects the first transparent conductive layer 6 to the light-emitting wafer 12, and the second anisotropic conductive adhesive layer 14 electrically connects the second transparent conductive layer 16 to the light-emitting wafer 12. As mentioned above, the first anisotropic conductive adhesive layer 8 and the second anisotropic conductive adhesive layer 14 comprise electrically conductive particles. The first anisotropic conductive adhesive layer 8, the second anisotropic conductive adhesive layer 14 and the light-emitting wafer 12 are laminated in a lamination step to be described hereinafter. Namely, a pressure is applied such that the first anisotropic conductive adhesive layer 8, the second anisotropic conductive adhesive layer 14 and the light-emitting wafer 12 are combined more firmly and that the light-emitting wafer 12 is electrically connected with conductive electrodes in the first anisotropic conductive adhesive layer 8 and the second anisotropic conductive adhesive layer 14 by means of the electrically conductive particles. The electrical connection by means of the electrically conductive particles will be described in detail hereinafter.

Alternatively, the first protective layer 2, the first fluorescent layer or quantum dot layer 4, the first transparent conductive layer 6, the first anisotropic conductive adhesive layer 8, the light-emitting wafer 12, the second anisotropic conductive adhesive layer 14, the second transparent conductive layer 16, the second fluorescent layer or quantum dot layer 18 and the second protective layer 20 are arranged plane-symmetrically about the light-emitting wafer 12. In other words, if the light-emitting wafer is taken as a symmetry plane, the first protective layer 2, the first fluorescent layer or quantum dot layer 4, the first transparent conductive layer 6, the first anisotropic conductive adhesive layer 8, the second anisotropic conductive adhesive layer 14, the second transparent conductive layer 16, the second fluorescent layer or quantum dot layer 18 and the second protective layer 20 are arranged plane-symmetrically. FIG. 1 basically shows such a symmetrical structure, and specific description of the symmetrical structure shall be described later.

Alternatively, the light-emitting wafer 12 can be an LED light-emitting wafer emitting red light, green light or blue light, and both the first fluorescent layer or quantum dot layer 4 and the second fluorescent layer or quantum dot layer 18 emit light of complementary color selected from cyan, purple and yellow.

For example, when the light-emitting wafer 12 is an LED light-emitting wafer emitting red light, both the first fluorescent layer or quantum dot layer 4 and the second fluorescent layer or quantum dot layer 18 emit light of a complementary color, i.e., cyan light, such that the double-side light-emitting device emits white light. When the light-emitting wafer 12 is an LED light-emitting wafer emitting green light, both the first fluorescent layer or quantum dot layer 4 and the second fluorescent layer or quantum dot layer 18 emit light of a complementary color, i.e., purple light, such that the double-side light-emitting device emits white light. When the light-emitting wafer 12 is an LED light-emitting wafer emitting blue light, both the first fluorescent layer or quantum dot layer 4 and the second fluorescent layer or quantum dot layer 18 emit light of a complementary color, i.e., yellow light, such that the double-side light-emitting device emits white light. In virtue of such arrangement, white light is generated by mixing, e.g., red light, green light and blue light emitted by the LED light-emitting wafer with the light of complementary colors emitted by the first fluorescent layer or quantum dot layer 4 and the second fluorescent layer or quantum dot layer 18, e.g., cyan light, purple light or yellow light. Explanations are given here only by taking a double-side light-emitting device emitting white light as an example, and when it is necessary for the double-side light-emitting device to emit light of other colors, a person with ordinary skill in the art can arrange correspondingly the light-emitting wafer 12 and the corresponding first fluorescent layer or quantum dot layer 4 and the second fluorescent layer or quantum dot layer 18 upon needs, which is not difficult to understand for the person with ordinary skill in the art.

Figure 2:
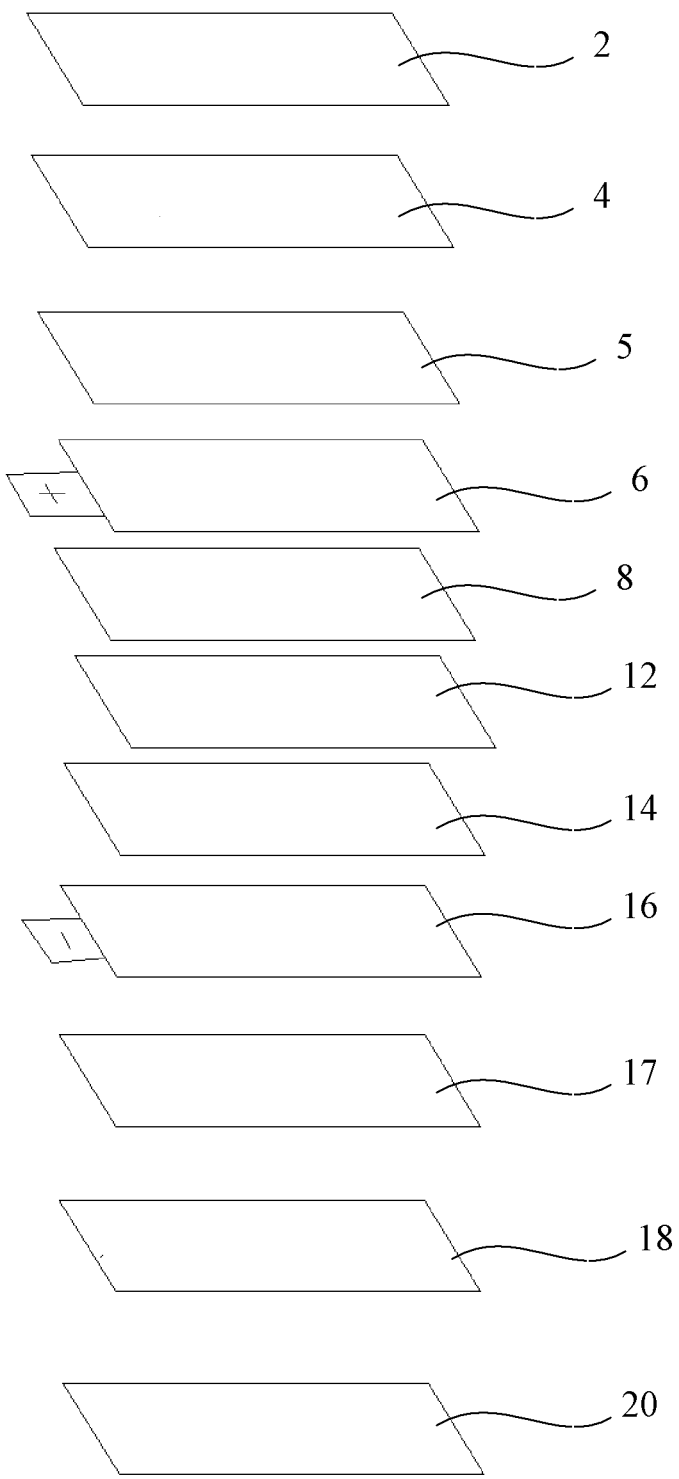
FIG. 2 schematically shows a double-side light-emitting device according to another embodiment of the present invention.
Figure 3:
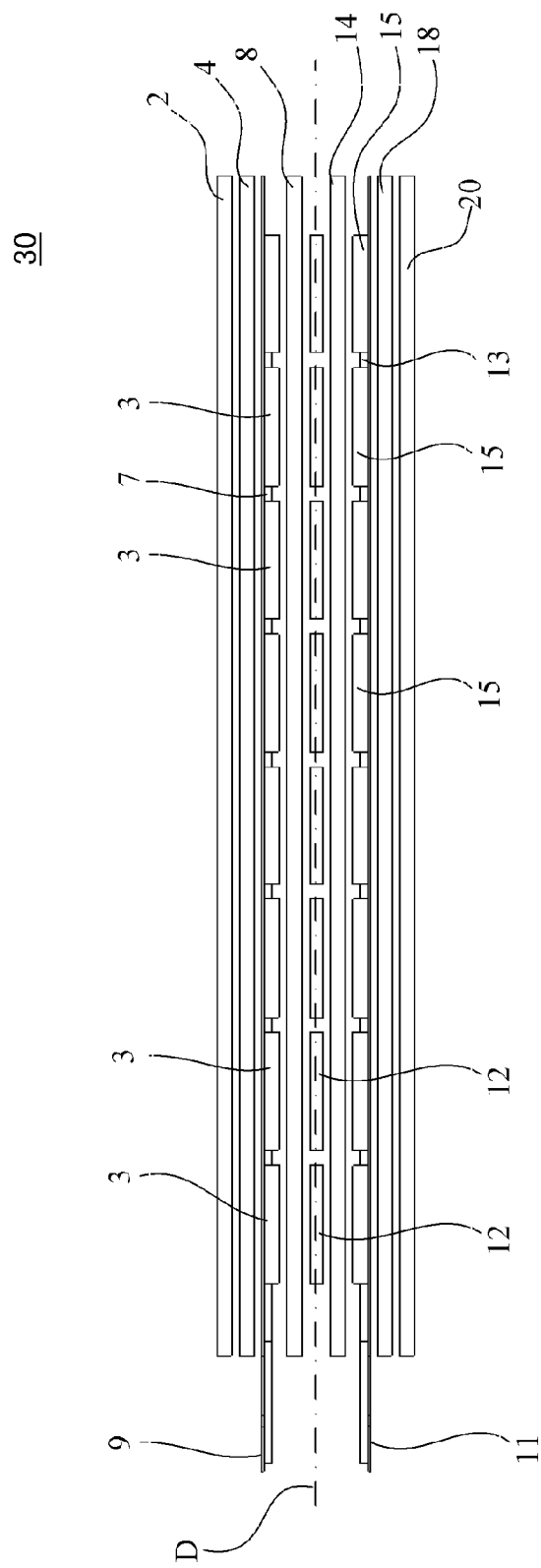
FIG. 3 schematically shows an array-type double-side light-emitting device according to an embodiment of the present invention.

FIG. 3 schematically shows an array-type double-side light-emitting device 30, which can comprise: a first protective layer 2, a first fluorescent layer or quantum dot layer 4, an array of first transparent conductive layers, a first anisotropic conductive adhesive layer 8, an array of light-emitting wafers 12, a second anisotropic conductive adhesive layer 14, an array of second transparent conductive layers, a second fluorescent layer or quantum dot layer 18 and a second protective layer 20, which are arranged together sequentially. The array of first transparent conductive layers shown in FIG. 3 comprises a plurality of conductive electrodes 3 of the first transparent conductive layer, a first transparent conductive layer substrate 9, and a plurality of conductive lines 7 of the first transparent conductive layer electrically connecting two adjacent conductive electrodes 3. Similarly, the array of second transparent conductive layers comprises a plurality of conductive electrodes 15 of the second transparent conductive layer, a second transparent conductive layer substrate 11, and a plurality of conductive lines 13 of the second transparent conductive layer electrically connecting two adjacent conductive electrodes 15. The array-type double-side light-emitting device 30 shown in FIG. 3 is essentially equivalent to an array of a plurality of double-side light-emitting devices shown in FIG. 1 or FIG. 2. The first protective layer 2, the first fluorescent layer or quantum dot layer 4, the first anisotropic conductive adhesive layer 8, the second anisotropic conductive adhesive layer 14, the second fluorescent layer or quantum dot layer 18 and the second protective layer 20 shown in FIG. 3 can be single layers respectively, e.g., the first protective layer 2 can be a single protective layer, instead of one in an array form, and the first fluorescent layer or quantum dot layer 4 can be a single fluorescent layer or quantum dot layer, instead of one in an array form. The array of first transparent conductive layers shown in FIG. 3 can be taken as a plurality of conductive electrodes 3 arranged on the first transparent conductive layer substrate 9, these conductive electrode 3 being electrically connected together by means of the plurality of conductive lines 7. Similarly, the array of second transparent conductive layers can be taken as a plurality of conductive electrodes 15 arranged on the second transparent conductive layer substrate 11, these conductive electrode 15 being electrically connected together by means of the plurality of conductive lines 13. The array of light-emitting wafers is an array composed of a plurality of light-emitting wafers 12. FIG. 4 schematically shows an array of first transparent conductive layers composed of a plurality of first transparent conductive layers 6 according to an embodiment of the present invention. Although FIG. 4 schematizes the array of first transparent conductive layers 6, it can also be used for describing the array of second transparent conductive layers.

Alternatively, the array-type double-side light-emitting device 30 can further comprise: a first transparent gel layer 5 arranged between the first fluorescent layer or quantum dot layer 4 and the first transparent conductive layer 6 array, and a second transparent gel layer 17 arranged between the second fluorescent layer or quantum dot layer 18 and the second transparent conductive layer 16 array as shown in FIG. 2. Since the array-type double-side light-emitting device 30 shown in FIG. 3 can be regarded as an array of a plurality of double-side light-emitting devices shown in FIG. 1 or FIG. 2, references to contents shown in FIG. 1 and FIG. 2 can be made for the array-type double-side light-emitting device 30 described herein.

In an embodiment of the array-type double-side light-emitting device 30 of the present invention, the first anisotropic conductive adhesive layer 8 electrically connects each first transparent conductive layer in the array of first transparent conductive layers to each light-emitting wafer 12 in the array of light-emitting wafers 12 in a corresponding manner, and the second anisotropic conductive adhesive layer 14 electrically connects each second transparent conductive layer 16 in the array of second transparent conductive layers to each light-emitting wafer in the array of light-emitting wafers 12 in a corresponding manner. FIG. 3 shows that the array of first transparent conductive layers comprises a first transparent conductive layer substrate 9 and an array of conductive electrodes 3 carried on the first transparent conductive layer substrate 9, and each light-emitting wafer in the array of light-emitting wafers 12 is arranged on the first anisotropic conductive adhesive layer 8 corresponding to each conductive electrode 3 in the array of first transparent conductive layer electrodes. Similarly, FIG. 3 shows that the array of second transparent conductive layers comprises a second transparent conductive layer substrate 11 and an array of conductive electrodes 15 carried on the second transparent conductive layer substrate 11, and each light-emitting wafer in the array of light-emitting wafers 12 is arranged on the second anisotropic conductive adhesive layer 18 corresponding to each conductive electrode 15 in the array of second transparent conductive layer electrodes.

In an embodiment of the array-type double-side light-emitting device 30, the first protective layer 2, the first fluorescent layer or quantum dot layer 4, the array of first transparent conductive layers 6, the first anisotropic conductive adhesive layer 8, the array of light-emitting wafers 12, the second anisotropic conductive adhesive layer 14, the array of second transparent conductive layers 16, the second fluorescent layer or quantum dot layer 18 and the second protective layer 20 are arranged plane-symmetrically about the array of light-emitting wafers 12. For example, FIG. 3 shows that the first protective layer 2, the first fluorescent layer or quantum dot layer 4, the array of first transparent conductive layers 6, the first anisotropic conductive adhesive layer 8, the second anisotropic conductive adhesive layer 14, the array of second transparent conductive layers 16, the second fluorescent layer or quantum dot layer 18 and the second protective layer 20 are arranged plane-symmetrically about the symmetry plane D. The symmetry plane D is a plane in which the plurality of light-emitting wafers 12 are located. The person with ordinary skill in the art can understand that in case of a curved array-type double-side light-emitting device, the array-type double-side light-emitting device 30 shown in FIG. 3 may be bended in a curved shape. Accordingly the symmetry plane D should also be in a curved shape, which is not difficult to understand.

Alternatively, the array of light-emitting wafers composed of a plurality of light-emitting wafers 12 can comprise LED light-emitting wafers emitting red light, green light or blue light, and both the first fluorescent layer or quantum dot layer 6 and the second fluorescent layer or quantum dot layer 18 emit light of complementary color selected from cyan, purple and yellow. As mentioned above, for example when the light-emitting wafer 12 is an LED light-emitting wafer emitting red light, both the first fluorescent layer or quantum dot layer 4 and the second fluorescent layer or quantum dot layer 18 emit light of a complementary color, i.e., cyan light, such that the double-side light-emitting device emits white light. When the light-emitting wafer 12 is an LED light-emitting wafer emitting green light, both the first fluorescent layer or quantum dot layer 4 and the second fluorescent layer or quantum dot layer 18 emit light of a complementary color, i.e., purple light, such that the double-side light-emitting device emits white light. When the light-emitting wafer 12 is an LED light-emitting wafer emitting blue light, both the first fluorescent layer or quantum dot layer 4 and the second fluorescent layer or quantum dot layer 18 emit light of a complementary color, i.e., yellow light, such that the double-side light-emitting device emits white light.

Figure 5:
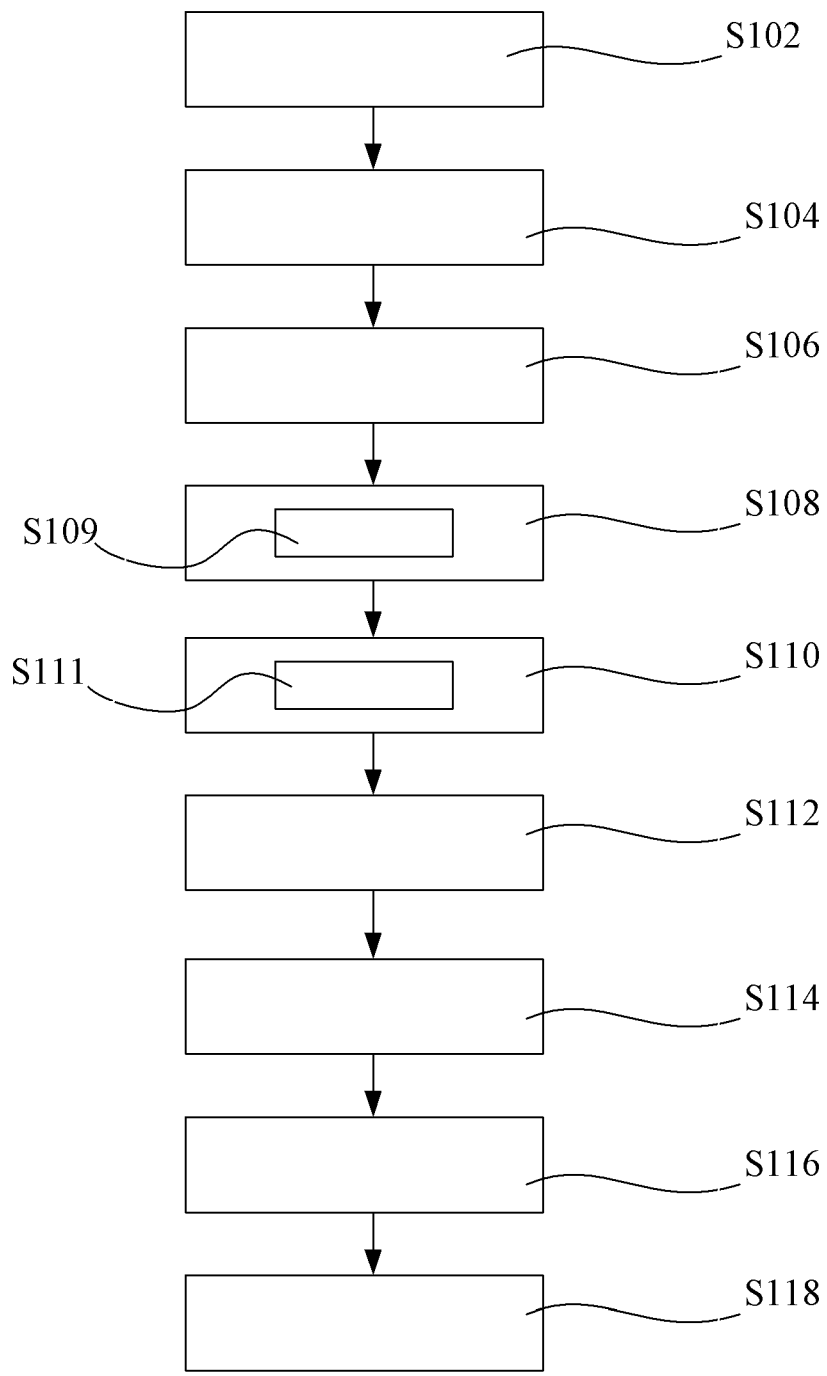
FIG. 5 schematically shows a flow diagram of the manufacture of an array-type double-side light-emitting device according to an embodiment of the present invention.

FIG. 5 shows a method for manufacturing an array-type double-side light-emitting device, which can comprise the following steps: S102, coating on or attaching to a first protective layer a first fluorescent layer or quantum dot layer; S104, arranging an array of first transparent conductive layers on the first fluorescent layer or quantum dot layer; S106, arranging a first anisotropic conductive adhesive layer on the array of first transparent conductive layers; S108, arranging an array of light-emitting wafers on the first anisotropic conductive adhesive layer; S110, arranging a second anisotropic conductive adhesive layer on the array of light-emitting wafers; S112, arranging an array of second transparent conductive layers on the second anisotropic conductive adhesive layer; S114, arranging a second fluorescent layer or quantum dot layer on the array of second transparent conductive layers; S116, arranging a second protective layer on the second fluorescent layer or quantum dot layer; S118, laminating the above layers such that each light-emitting wafer in the array of light-emitting wafers is electrically connected to a corresponding first transparent conductive layer in the array of first transparent conductive layers and a corresponding second transparent conductive layer in the array of second transparent conductive layers. The above steps of manufacturing an array-type double-side light-emitting device is equivalent to arranging together the first protective layer 2, the first fluorescent layer or quantum dot layer 4, the first transparent conductive layer 4, the first anisotropic conductive adhesive layer 8, the array of light-emitting wafers 12, the second anisotropic conductive adhesive layer 14, the array of second transparent conductive layers 16, the second fluorescent layer or quantum dot layer 18 and the second protective layer 20 in the above sequence. Finally, the above layers are laminated such that each light-emitting wafer in the array of light-emitting wafers is electrically connected to a corresponding first transparent conductive layer in the array of first transparent conductive layers and a corresponding second transparent conductive layer in the array of second transparent conductive layers.

In an embodiment of the method for manufacturing an array-type double-side light-emitting device, wherein the step S108 of arranging the array of light-emitting wafers on the first anisotropic conductive gel layer can further comprise a step of S109, providing a first transparent conductive layer substrate, arranging an array of first transparent conductive layer electrodes on the first transparent conductive layer substrate to form the array of first transparent conductive layer, and arranging the array of light-emitting wafers on the first anisotropic conductive adhesive layer in such a manner that each light-emitting wafer in the array of light-emitting wafers corresponds to each first transparent conductive layer electrode in the array of first transparent conductive layer electrodes.

In an embodiment of the method for manufacturing an array-type double-side light-emitting device, wherein the step S112 of arranging the array of second transparent conductive layers on the second anisotropic conductive adhesive layer can further comprise a step of S113, providing a second transparent conductive layer substrate, arranging an array of second transparent conductive layer electrodes on the second transparent conductive layer substrate to form the array of second transparent conductive layers, and arranging the array of second transparent conductive layers on the second anisotropic conductive adhesive layer in such a manner that each second transparent conductive layer electrode in the array of second transparent conductive layer electrodes corresponds to each light-emitting wafer in the array of light-emitting wafers.

Alternatively, wherein the step S104 of arranging the array of first transparent conductive layers on the first fluorescent layer or quantum dot layer can comprise a step of arranging the array of first transparent conductive layers on the first fluorescent layer or quantum dot layer by means of a first transparent gel layer; and the step S114 of arranging the second fluorescent layer or quantum dot layer on the array of second transparent conductive layers can comprise a step of arranging the second fluorescent layer or quantum dot layer on the array of second transparent conductive layers by means of a second transparent gel layer.

Optionally, the array of light-emitting wafers comprises LED light-emitting wafers emitting red light, green light or blue light, and both the first fluorescent layer or quantum dot layer and the second fluorescent layer or quantum dot layer emit light of complementary color selected from cyan, purple and yellow.

Figure 6:
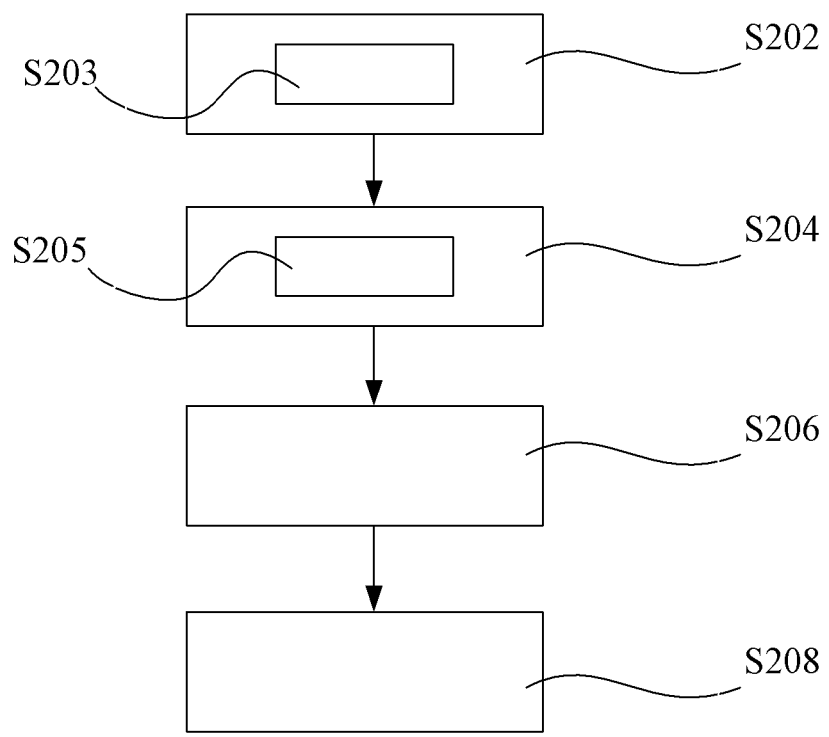
FIG. 6 schematically shows a flow diagram of the manufacture of an array-type double-side light-emitting device according to another embodiment of the present invention.

FIG. 6 shows a method of manufacturing an array-type double-side light-emitting device, which can comprise steps of: S202, attaching an array of first transparent conductive layers to an array of light-emitting wafers by means of a first anisotropic conductive adhesive layer; S204, attaching the array of light-emitting wafers to an array of second transparent conductive layers by means of a second anisotropic conductive adhesive layer; S206, laminating the array of first transparent conductive layers, the array of light-emitting wafers and the array of second transparent conductive layers such that the array of first transparent conductive layers and the array of second transparent conductive layers are electrically connected to the array of light-emitting wafers; and S208, coating a first fluorescent layer or quantum dot layer and a second fluorescent layer or quantum dot layer on a surface of the array of first transparent conductive layers and a surface of the array of second transparent conductive layers respectively, and coating a first protective layer and a second protective layer on the first fluorescent layer or quantum dot layer and the second fluorescent layer or quantum dot layer respectively. The method of manufacturing an array-type double-side light-emitting device shown in FIG. 6 is equivalent to, centering on an array of the light-emitting wafers, sequentially arranging an array of first transparent conductive layers on a surface of an array of light-emitting wafers (by means of a first anisotropic conductive adhesive layer), an array of second transparent conductive layers on an opposite surface of the array of light-emitting wafers (by means of a second anisotropic conductive adhesive layer), and then sequentially coating a first fluorescent layer or quantum dot layer and a second fluorescent layer or quantum dot layer on a surface of a corresponding array of transparent conductive layers respectively and coating a first protective layer and a second protective layer on a surface of the corresponding first fluorescent layer or quantum dot layer and the second fluorescent layer or quantum dot layer respectively.

In an embodiment of the method for manufacturing an array-type double-side light-emitting device of the present invention, wherein the step S202 of attaching an array of first transparent conductive layers to an array of light-emitting wafers by means of a first anisotropic conductive adhesive layer can further comprise a step of S203, providing a first transparent conductive layer substrate, arranging an array of first transparent conductive layer electrodes on the first transparent conductive layer substrate to form the array of first transparent conductive layers, and attaching each first transparent conductive layer electrode in the array of first transparent conductive layer electrodes to each light-emitting wafer in the array of light-emitting wafers in a corresponding manner by means of the first anisotropic conductive adhesive layer.

Likewise, in an embodiment of the method for manufacturing an array-type double-side light-emitting device of the present invention, wherein the step S204 of attaching the array of light-emitting wafers to the array of second transparent conductive layers by means of the second anisotropic conductive adhesive layer can further comprise a step of S205, providing a second transparent conductive layer substrate, arranging an array of second transparent conductive layer electrodes carried on the second transparent conductive layer substrate to form the array of second transparent conductive layers, and attaching each light-emitting wafer in the array of light-emitting wafers to each second transparent conductive layer electrode in the array of second transparent conductive layer electrodes in a corresponding manner by means of the second anisotropic conductive adhesive layer.

Alternatively, wherein the array of light-emitting wafers can comprise LED light-emitting wafers emitting red light, green light or blue light, and both the first fluorescent layer or quantum dot layer and the second fluorescent layer or quantum dot layer emit light of complementary color selected from cyan, purple and yellow.

According to a fifth aspect of the present invention, a double-side display device is provided, comprising the above double-side light-emitting device, the above array-type double-side light-emitting device, or an array-type double-side light-emitting device manufactured by using the above method for manufacturing an array-type double-side light-emitting device.

Although the present invention has been described with reference to the embodiments currently taken into consideration, it should be understood that the present invention is not limited to the disclosed embodiments. On the contrary, the present invention aims to cover various modifications and equivalent arrangements within the spirit and scope of the appended claims. The scopes of the following claims are subject to the broadest explanations so as to include each of such modifications and equivalent structures and functions.

The invention claimed is:

1. A double-side light-emitting device, comprising: a first protective layer, a first fluorescent layer or quantum dot layer, a first transparent conductive layer, a first anisotropic conductive adhesive layer, a light-emitting wafer, a second anisotropic conductive adhesive layer, a second transparent conductive layer, a second fluorescent layer or quantum dot layer and a second protective layer, which are arranged together sequentially.

2. The double-side light-emitting device according to claim 1, wherein the double-side light-emitting device further comprises: a first transparent gel layer arranged between the first fluorescent layer or quantum dot layer and the first transparent conductive layer, and a second transparent gel layer arranged between the second fluorescent layer or quantum dot layer and the second transparent conductive layer.

3. The double-side light-emitting device according to claim 1, wherein the first anisotropic conductive adhesive layer electrically connects the first transparent conductive layer to the light-emitting wafer, and the second anisotropic conductive adhesive layer electrically connects the second transparent conductive layer to the light-emitting wafer.

4. The double-side light-emitting device according to claim 1, wherein the first protective layer, the first fluorescent layer or quantum dot layer, the first transparent conductive layer, the first anisotropic conductive adhesive layer, the light-emitting wafer, the second anisotropic conductive adhesive layer, the second transparent conductive layer, the second fluorescent layer or quantum dot layer and the second protective layer are arranged plane-symmetrically about the light-emitting wafer.

5. The double-side light-emitting device according to claim 4, wherein the light-emitting wafer is an LED light-emitting wafer emitting red light, green light or blue light, and both the first fluorescent layer or quantum dot layer and the second fluorescent layer or quantum dot layer emit light of complementary color selected from cyan, purple and yellow.

6. A double-side display device, comprising the double-side light-emitting device according to claim 1.

7. An array-type double-side light-emitting device, comprising:
a first protective layer, a first fluorescent layer or quantum dot layer, an array of first transparent conductive layers, a first anisotropic conductive adhesive layer, an array of light-emitting wafers, a second anisotropic conductive adhesive layer, an array of second transparent conductive layers, a second fluorescent layer or quantum dot layer and a second protective layer, which are arranged together sequentially.

8. The array-type double-side light-emitting device according to claim 7, wherein the array-type double-side light-emitting device further comprises:
a first transparent gel layer arranged between the first fluorescent layer or quantum dot layer and the array of first transparent conductive layers, and a second transparent gel layer arranged between the second fluorescent layer or quantum dot layer and the array of second transparent conductive layers.

9. The array-type double-side light-emitting device according to claim 7, wherein the first anisotropic conductive adhesive layer electrically connects each first transparent conductive layer in the array of first transparent conductive layers to each light-emitting wafer in the array of light-emitting wafers in a corresponding manner, and the second anisotropic conductive adhesive layer electrically connects each second transparent conductive layer in the array of second transparent conductive layers to each light-emitting wafer in the array of light-emitting wafers in a corresponding manner.

10. The array-type double-side light-emitting device according to claim 7, wherein the first protective layer, the first fluorescent layer or quantum dot layer, the array of first transparent conductive layers, the first anisotropic conductive adhesive layer, the array of light-emitting wafers, the second anisotropic conductive adhesive layer, the array of second transparent conductive layers, the second fluorescent layer or quantum dot layer and the second protective layer are arranged plane-symmetrically about the array of light-emitting wafers.

11. The array-type double-side light-emitting device according to claim 10, wherein the array of light-emitting wafers comprises LED light-emitting wafers emitting red light, green light or blue light, and both the first fluorescent layer or quantum dot layer and the second fluorescent layer or quantum dot layer emit light of complementary color selected from cyan, purple and yellow.

12. A method for manufacturing the array-type double-side light-emitting device of claim 7, comprising steps of:
S102, coating or arranging a first fluorescent layer or quantum dot layer on a first protective layer;
S104, arranging an array of first transparent conductive layers on the first fluorescent layer or quantum dot layer;
S106, arranging a first anisotropic conductive adhesive layer on the array of first transparent conductive layers;
S108, arranging an array of light-emitting wafers on the first anisotropic conductive adhesive layer;
S110, arranging a second anisotropic conductive adhesive layer on the array of light-emitting wafers;
S112, arranging an array of second transparent conductive layers on the second anisotropic conductive adhesive layer;
S114, arranging a second fluorescent layer or quantum dot layer on the array of second transparent conductive layers;
S116, arranging a second protective layer on the second fluorescent layer or quantum dot layer; and
S118, laminating the layers such that each light-emitting wafer in the array of light-emitting wafers is electrically connected to a corresponding first transparent conductive layer in the array of first transparent conductive layers and a corresponding second transparent conductive layer in the array of second transparent conductive layers.

13. The method according to claim 12, wherein the step S108 of arranging the array of light-emitting wafers on the first anisotropic conductive gel layer comprises a step of:
S109, providing a first transparent conductive layer substrate, arranging an array of first transparent conductive layer electrodes on the first transparent conductive layer substrate to form the array of first transparent conductive layer, and arranging the array of light-emitting wafers on the first anisotropic conductive adhesive layer in such a manner that each light-emitting wafer in the array of light-emitting wafers corresponds to each first transparent conductive layer electrode in the array of first transparent conductive layer electrodes.

14. The method according to claim 12, wherein the step S112 of arranging the array of second transparent conductive layers on the second anisotropic conductive adhesive layer comprises a step of:
S113, providing a second transparent conductive layer substrate, arranging an array of second transparent conductive layer electrodes on the second transparent conductive layer substrate to form the array of second transparent conductive layers, and arranging the array of second transparent conductive layers on the second anisotropic conductive adhesive layer in such a manner that each second transparent conductive layer electrode in the array of second transparent conductive layer electrodes corresponds to each light-emitting wafer in the array of light-emitting wafers.

15. The method according to claim 13, wherein the step S104 of arranging the array of first transparent conductive layers on the first fluorescent layer or quantum dot layer comprises a step of arranging the array of first transparent conductive layers on the first fluorescent layer or quantum dot layer by means of a first transparent gel layer, and the step S114 of arranging the second fluorescent layer or quantum dot layer on the array of second transparent conductive layers comprises a step of arranging the second fluorescent layer or quantum dot layer on the array of second transparent conductive layers by means of a second transparent gel layer.

16. The method according to claim 12, wherein the array of light-emitting wafers comprises LED light-emitting wafers emitting red light, green light or blue light, and both the first fluorescent layer or quantum dot layer and the second fluorescent layer or quantum dot layer emit light of complementary color selected from cyan, purple and yellow.

17. A method for manufacturing the array-type double-side light-emitting device of claim 7, comprising steps of:
   S202, attaching an array of first transparent conductive layers to an array of light-emitting wafers by means of a first anisotropic conductive adhesive layer;
   S204, attaching the array of light-emitting wafers to an array of second transparent conductive layers by means of a second anisotropic conductive adhesive layer;
   S206, laminating the array of first transparent conductive layers, the array of light-emitting wafers and the array of second transparent conductive layers such that the array of first transparent conductive layers and the array of second transparent conductive layers are electrically connected to the array of light-emitting wafers; and
   S208, coating a first fluorescent layer or quantum dot layer and a second fluorescent layer or quantum dot layer respectively on a surface of the array of first transparent conductive layers and a surface of the array of second transparent conductive layers, and coating a first protective layer and a second protective layer respectively on the first fluorescent layer or quantum dot layer and the second fluorescent layer or quantum dot layer.

18. The method according to claim 17, wherein the step S202 of attaching the array of first transparent conductive layers to the array of light-emitting wafers by means of the first anisotropic conductive adhesive layer comprises a step of:
   S203, providing a first transparent conductive layer substrate, arranging an array of first transparent conductive layer electrodes on the first transparent conductive layer substrate to form the array of first transparent conductive layers, and attaching each first transparent conductive layer electrode in the array of first transparent conductive layer electrodes to each light-emitting wafer in the array of light-emitting wafers in a corresponding manner by means of the first anisotropic conductive adhesive layer.

19. The method according to claim 17, wherein the step S204 of attaching the array of light-emitting wafers to the array of second transparent conductive layers by means of the second anisotropic conductive adhesive layer comprises a step of:
   S205, providing a second transparent conductive layer substrate, arranging an array of second transparent conductive layer electrodes carried on the second transparent conductive layer substrate to form the array of second transparent conductive layers, and attaching each light-emitting wafer in the array of light-emitting wafers to each second transparent conductive layer electrode in the array of second transparent conductive layer electrodes in a corresponding manner by means of the second anisotropic conductive adhesive layer.

20. The method according to claim 17, wherein the array of light-emitting wafers comprises LED light-emitting wafers emitting red light, green light or blue light, and both the first fluorescent layer or quantum dot layer and the second fluorescent layer or quantum dot layer emit light of complementary color selected from cyan, purple and yellow.

* * * * *